(12) United States Patent
Zhang et al.

(10) Patent No.: US 12,262,622 B2
(45) Date of Patent: Mar. 25, 2025

(54) DISPLAY PANEL

(71) Applicants: Chengdu BOE Optoelectronics Technology Co., Ltd., Beijing (CN); BOE Technology Group Co., Ltd., Beijing (CN)

(72) Inventors: Yuanqi Zhang, Beijing (CN); Ping Wen, Beijing (CN); Shun Zhang, Beijing (CN); Chang Luo, Beijing (CN); Yi Zhang, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 574 days.

(21) Appl. No.: 17/552,692

(22) Filed: Dec. 16, 2021

(65) Prior Publication Data
US 2022/0310714 A1    Sep. 29, 2022

(30) Foreign Application Priority Data

Mar. 25, 2021    (CN) .......................... 202110320467.4

(51) Int. Cl.
*H10K 59/88* (2023.01)
*H10K 50/844* (2023.01)
(Continued)

(52) U.S. Cl.
CPC ........... *H10K 59/88* (2023.02); *H10K 50/844* (2023.02); *H10K 59/40* (2023.02); *H10K 71/00* (2023.02)

(58) Field of Classification Search
CPC ........ H10K 59/88; H10K 59/40; H10K 59/10; H10K 59/65; H10K 50/844; H10K 71/00; H10K 71/70; H01L 22/12; H01L 22/32
See application file for complete search history.

(56) References Cited

U.S. PATENT DOCUMENTS

| | | | |
|---|---|---|---|
| 11,282,420 B2 | 3/2022 | Han et al. | |
| 2018/0061728 A1* | 3/2018 | Chen | H10K 50/844 |

(Continued)

FOREIGN PATENT DOCUMENTS

| | | |
|---|---|---|
| CN | 110264891 A | 9/2019 |
| CN | 111158517 A | 5/2020 |

(Continued)

OTHER PUBLICATIONS

China Patent Office, First Office Action dated Sep. 14, 2022, for corresponding Chinese application 202110320467.4.

*Primary Examiner* — Shaun M Campbell
(74) *Attorney, Agent, or Firm* — HOUTTEMAN LAW LLC

(57) ABSTRACT

A display panel has an opening region, a display region, and first and second peripheral regions; and includes a substrate, a first barrier structure surrounding the display region and in the first peripheral region, a second barrier structure surrounding the opening region and in the second peripheral region, and a crack detection line including first and second portions. The first portion surrounds the opening region, and is on a side of the second barrier structure distal to the display region. Both ends of the second portion are respectively connected to both ends of the first portion. Orthogonal projections of the second portion and the second barrier structure on the substrate overlap each other. The second portion extends into the first peripheral region through the display region. A height of a portion of the second barrier structure overlapping the second portion is less than that of the first barrier structure.

15 Claims, 4 Drawing Sheets

(51) Int. Cl.
*H10K 59/40* (2023.01)
*H10K 71/00* (2023.01)

(56) References Cited

U.S. PATENT DOCUMENTS

| | | | |
|---|---|---|---|
| 2018/0233541 A1* | 8/2018 | Zeng | G06F 3/0445 |
| 2020/0127220 A1* | 4/2020 | Kim | H10K 50/11 |
| 2020/0127233 A1* | 4/2020 | Sung | H10K 59/122 |
| 2020/0175900 A1* | 6/2020 | Han | G06F 3/0443 |
| 2020/0175901 A1 | 6/2020 | Lee et al. | |
| 2021/0200361 A1* | 7/2021 | Park | G06F 3/0412 |
| 2021/0384225 A1* | 12/2021 | Zhang | H01L 27/1244 |
| 2022/0057445 A1* | 2/2022 | Polomoff | G01R 31/2853 |
| 2022/0130937 A1 | 4/2022 | Zhao et al. | |

FOREIGN PATENT DOCUMENTS

| | | |
|---|---|---|
| CN | 111243435 A | 6/2020 |
| CN | 111261045 A | 6/2020 |
| CN | 112349867 A | 2/2021 |
| CN | 112366280 A | 2/2021 |

\* cited by examiner

DISPLAY PANEL

CROSS REFERENCE TO RELATED APPLICATIONS

The present application claims priority to Chinese patent application No. 202110320467.4, filed on Mar. 25, 2021, the content of which is incorporated herein by reference in its entirety.

TECHNICAL FIELD

The present disclosure relates to the field of display technology, and in particular, to a display panel.

BACKGROUND

An Organic Light-Emitting diode (OLED) display panel has the advantages of self-luminescence, high brightness, good picture quality, low energy consumption, and the like, and thus becomes a mainstream development direction in the field of display technology.

In a manufacturing process of the display panel, in order to accurately detect whether there is a crack at an edge of a substrate of the display panel, it is generally necessary to provide a crack detection line at the edge of the substrate and at an opening where a camera and/or the like is disposed. However, the crack detection line may be subjected to short circuit due to residual metal during the manufacturing process of the display panel, thereby negatively affecting the detection of the presence of a crack by the crack detection line.

SUMMARY

A first aspect of the present disclosure provides a display panel, having an opening region, a display region, a first peripheral region, and a second peripheral region, the opening region being in the display region, the first peripheral region being on a side of the display region distal to the opening region, the second peripheral region being between the opening region and the display region, the display panel including:
  a substrate;
  a first barrier structure on the substrate, surrounding the display region, and in the first peripheral region;
  a second barrier structure on the substrate, surrounding the opening region, and in the second peripheral region; and
  a crack detection line on the substrate, wherein the crack detection line includes a first portion and a second portion, the first portion surrounds the opening region and is in the second peripheral region, both ends of the first portion have a gap therebetween, the first portion of the crack detection line is on a side of the second barrier structure distal to the display region, both ends of the second portion are connected to both ends of the first portion, respectively, an orthogonal projection of the second portion on the substrate overlaps an orthogonal projection of the second barrier structure on the substrate, the second portion extends into the first peripheral region through the display region, and a height of a portion, which overlaps the second portion, of the second barrier structure is less than a height of the first barrier structure, and each height is a dimension in a direction perpendicular to the substrate.

In an embodiment, a height of a remaining portion of the second barrier structure except the portion of the second barrier structure overlapping the second portion is greater than the height of the portion of the second barrier structure overlapping the second portion.

In an embodiment, a height of any portion of the second barrier structure is less than the height of the first barrier structure.

In an embodiment, the height of the portion of the second barrier structure overlapping the second portion ranges from 1 μm to 2 μm.

In an embodiment, an angle between a sidewall of the portion of the second barrier structure overlapping the second portion and the substrate is an acute angle.

In an embodiment, an angle between a sidewall of any portion of the second barrier structure and the substrate is an acute angle.

In an embodiment, the acute angle ranges from 20° to 45°.

In an embodiment, the second barrier structure includes at least two layer structures stacked together, and a layer structure of the at least two layer structures farther away from the substrate covers a layer structure of the at least two layer structures closer to the substrate.

In an embodiment, a maximum distance between two sidewalls of the layer structure of the at least two layer structures farther away from the substrate is greater than 20 μm.

In an embodiment, a minimum distance, between a lower end of a sidewall of the layer structure of the at least two layer structures farther away from the substrate and a lower end of a sidewall of the layer structure of the at least two layer structures closer to the substrate, is greater than 5 μm.

In an embodiment, the second barrier structure includes two sub-dams spaced apart from each other.

In an embodiment, a minimum distance between the two sub-dams of the second barrier structure is greater than 20 μm.

A second aspect of the present disclosure provides a display panel, having an opening region, a display region, a first peripheral region, and a second peripheral region, the opening region being in the display region, the first peripheral region being on a side of the display region distal to the opening region, the second peripheral region being between the opening region and the display region, the display panel including:
  a substrate;
  a first barrier structure on the substrate, surrounding the display region, and in the first peripheral region;
  a second barrier structure on the substrate, surrounding the opening region, and in the second peripheral region; and
  a crack detection line on the substrate, wherein the crack detection line includes a first portion and a second portion, the first portion surrounds the opening region and is in the second peripheral region, both ends of the first portion have a gap therebetween, the first portion is on a side of the second barrier structure proximal to the display region, both ends of the second portion are connected to both ends of the first portion, respectively, and the second portion extends into the first peripheral region through the display region.

In an embodiment, a height of any portion of the second barrier structure is less than or equal to a height of the first barrier structure.

In an embodiment, an angle between a sidewall of any portion of the second barrier structure and the substrate is an acute angle.

In an embodiment, the acute angle ranges from 20° to 45°.

In an embodiment, the second barrier structure includes at least two layer structures stacked together, and a layer structure of the at least two layer structures farther away from the substrate covers a layer structure of the at least two layer structures closer to the substrate.

18. The display panel according to claim 17, wherein a maximum distance between two sidewalls of the layer structure of the at least two layer structures farther away from the substrate is greater than 20 μm.

In an embodiment, a minimum distance, between a lower end of a sidewall of the layer structure of the at least two layer structures farther away from the substrate and a lower end of a sidewall of the layer structure of the at least two layer structures closer to the substrate, is greater than 5 μm.

In an embodiment, the second barrier structure includes two sub-dams spaced apart from each other, and a minimum distance between the two sub-dams of the second barrier structure is greater than 20 μm.

BRIEF DESCRIPTION OF THE DRAWINGS

The accompanying drawings, which are included to provide a further understanding of the present disclosure and constitute a part of this specification, illustrate the present disclosure together with the following exemplary embodiments, but are not intended to limit the present disclosure. In the drawings:

FIG. 3 is a schematic cross-sectional view of the display panel shown in FIG. 1 taken along a line XX;

FIG. 4 is a schematic cross-sectional view of the display panel shown in FIG. 1 taken along the line XX;

DETAILED DESCRIPTION

Figure 1:
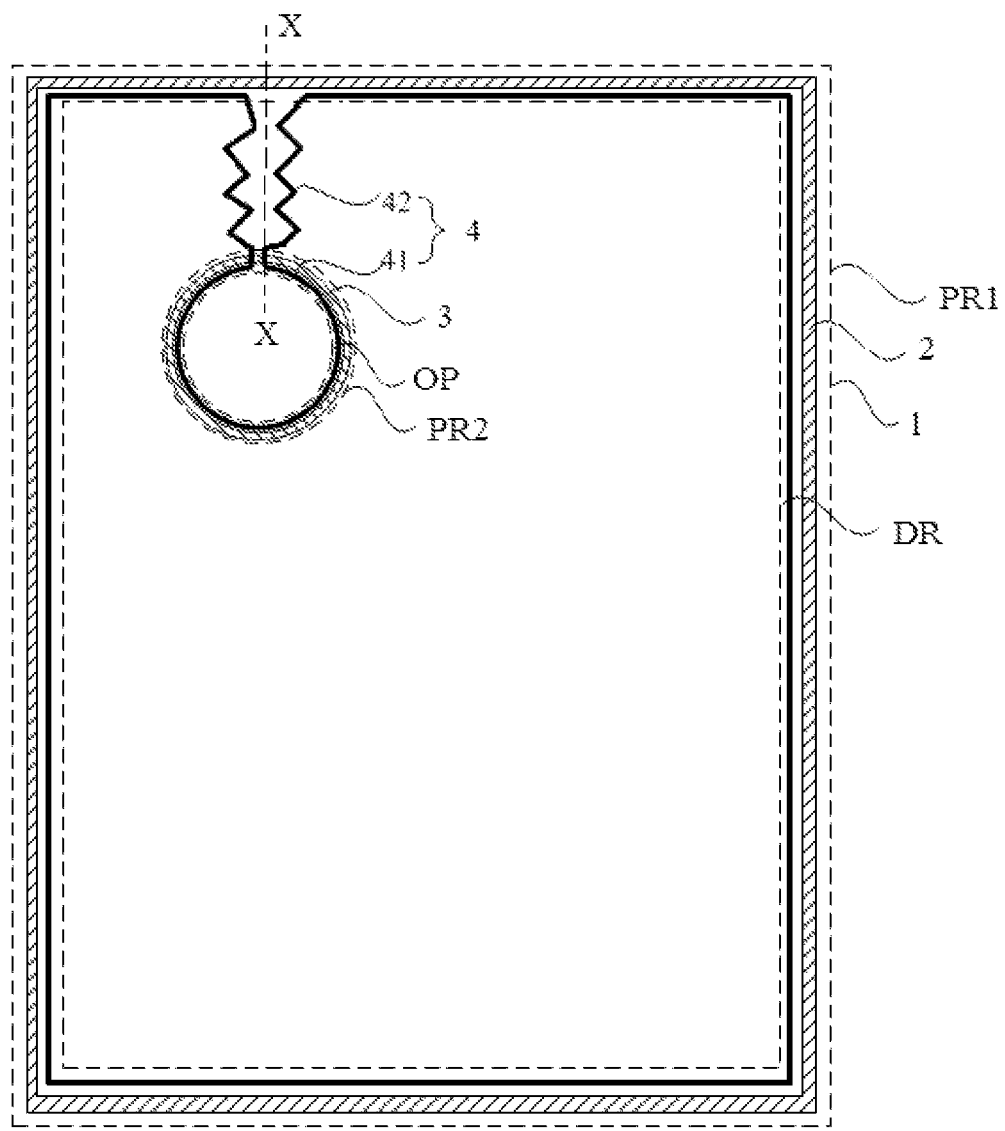
FIG. 1 is a schematic diagram showing a structure of a display panel according to an embodiment of the present disclosure.

To enable one of ordinary skill in the art to better understand technical solutions of the present disclosure, the present disclosure will be further described below with reference to the accompanying drawings and exemplary embodiments.

In the present disclosure, two structures being provided (or disposed or arranged) in a same layer means that the two structures are made of a same layer of material (e.g., a same material) and thus are in a same layer in a stacking relationship (i.e., a relationship between stacked layers), but do not mean that they are equidistant from a same substrate nor that other layers between the two structures and the same substrate are identical in structure.

In the present disclosure, a "patterning process" refers to step(s) of forming a structure having a certain pattern, and may be a photolithography process including one or more steps of forming a material layer, coating a photoresist, exposing, developing, etching, stripping off the photoresist, and the like. Alternatively, the "patterning process" may be an imprinting process, an inkjet printing process, or another process.

The present disclosure will be described in more detail below with reference to the accompanying drawings. Like elements are denoted by like reference symbols throughout the various figures. For purposes of clarity, the various features in the drawings are not necessarily drawn to scale. Further, certain well-known elements may not be shown in the figures.

Numerous specific details of the present disclosure, such as structures, materials, dimensions, processing processes and techniques of the components, are set forth in the following description in order to provide a more thorough understanding of the present disclosure. However, as will be understood by one of ordinary skill in the art, the present disclosure may be practiced without these specific details.

In the embodiment of the present disclosure, a display panel may be a display panel capable of realizing full-screen display (i.e., a ratio of a display area of the display panel to a total area of a light-emitting (light outgoing) surface reaches or approaches to 100%). In this case, an opening region needs to be formed in a display region of the display panel for mounting a camera, an earphone, and/or the like, so that a border of the formed display panel is relatively narrow. During a manufacturing process of the display panel, cracks are easy to occur at edges of the display panel (including an edge of the opening region and an edge of the display region). If the cracks extend into the display region, a display performance of the display panel is degraded.

In order to avoid the display panel from cracking, in an embodiment of the present disclosure, a crack detection line may be formed at the edges of the display panel (including the edge of the opening region and the edge of the display region). The crack detection line surrounds both the edge of the opening region and the edge of the display region, and the crack detection line is, for example, a continuous conductive line. With such a configuration, if a crack of the display panel extends to a position where the crack detection line is located, the crack detection line may be broken due to the crack. That is, when it is detected by a detection device that the crack detection line of the display panel is broken, it indicates that the display panel has a crack therein.

In addition, the display panel according to an embodiment of the present disclosure may include a barrier structure surrounding the opening region, and the barrier structure may prevent an organic material from entering the opening region when an organic structural layer (such as an organic light-emitting layer) of the display region of the display panel is formed, which can protect a structure of the opening region.

Figure 6:
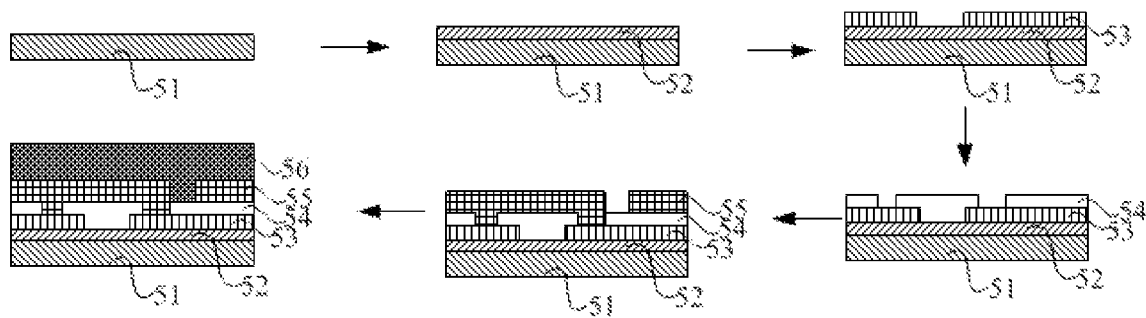
FIG. 6 is a schematic diagram showing structures of a touch structure of a display panel in steps of a method for manufacturing the touch structure, according to an embodiment of the present disclosure.

The display panel according to an embodiment of the present disclosure may further include a touch structure. For example, the barrier structure may be formed firstly, and secondly, a touch electrode and the crack detection line are formed. The touch electrode may include a first electrode and a second electrode. Specifically, steps of forming the touch structure may include the following steps 1 to 5, as shown in FIG. 6.

In step 1, a first insulating layer 52 is formed on an encapsulation layer 51, which is for encapsulating a display unit, of the display panel.

In step 2, a first electrode layer 53 is formed on the first insulating layer 52 by using a patterning process.

In step 3, a second insulating layer 54 is formed on the first electrode layer 53.

In step 4, a second electrode layer 55 is formed on the second insulating layer 54 by using a patterning process.

In step 5, an organic encapsulation layer 56 is formed on the second electrode layer 55.

In this way, the touch control structure is obtained.

However, during the manufacturing process of the display panel, a residual metal (e.g., a residual metal generated after forming the touch electrode) may be formed near the barrier structure. The inventors of the present inventive concept have found that, the residual metal is generated mainly because a slope of a sidewall of the barrier structure is too steep or the barrier structure is high, so that a dead angle (or a dead area) is formed at the sidewall of the barrier structure, and the metal in the dead angle is not easy to be removed completely.

As shown in FIG. 1, the crack detection line 4 needs to cross the barrier structure 3 so as to extend from the edge of the opening region to the edge of the display region, and a distance between two portions (e.g., two portions of a second portion 42 as shown in FIG. 1), which cross the barrier structure 3, of the crack detection line 4, is small. Due to the residual metal near the barrier structure 3, a short circuit phenomenon may occur between the two portions of the crack detection line 4 crossing the barrier structure 3, thereby degrading a detection performance of the crack detection line 4.

Aiming at the problem that the crack detection line 4 is easy to undergo short circuit in the display panel, embodiments of the present disclosure provide the following technical solutions.

In a first aspect, as shown in FIGS. 1 to 4, a display panel has an opening region OP (in which an opening or a hole is formed), a display region DR, a first peripheral region PR1 (e.g., a region between two dotted-line rectangular boxes in FIG. 1), and a second peripheral region PR2 (e.g., a region between two dotted-line circular boxes in FIG. 1). The opening region is located in the display region DR, and the first peripheral region PR1 is located on a side of the display region DR distal to the opening region OP. The second peripheral region PR2 is located between the opening region OP and the display region DR. The display panel includes: a substrate 1, a first barrier structure 2, a second barrier structure 3, and a crack detection line 4. For example, the first barrier structure 2 is located on the substrate 1, surrounds the display region DR, and is in the first peripheral region PR1. The second barrier structure 3 is located on the substrate 1, surrounds the opening region OP, and is in the second peripheral region PR2. The crack detection line 4 is on the substrate 1, and includes a first portion 41 (e.g., a portion approximate to a circle but not a closed circle as shown in FIG. 1) and a second portion 42 (e.g., a portion approximate to a rectangular box and a line connected between the rectangular box and the first portion 41 as shown in FIG. 1). The first portion 41 surrounds the opening region OP and is located in the second peripheral region PR2, and both ends of the first portion 41 are spaced apart from each other by a gap. The first portion 41 of the crack detection line 4 is located at a side of the second barrier structure 3 distal to the display region DR. Both ends of the second portion 42 are connected to both ends of the first portion 41, respectively. An orthogonal projection of the second portion 42 on the substrate 1 overlaps an orthogonal projection of the second barrier structure 3 on the substrate 1, and the second portion 42 extends through the display region DR into the first peripheral region PR1. A height of a portion, which overlaps the second portion 42, of the second barrier structure 3 (e.g., the portion of the second barrier structure 3 located in a region P shown in FIG. 2) is less than a height of the first barrier structure 2, the height being a dimension (e.g., relative to an upper surface of the substrate 1) in a direction perpendicular to the substrate 1. In other words, a top surface of the portion of the second barrier structure 3 overlapping the second portion 42 is lower than a top surface of the first barrier structure 2, in the direction perpendicular to the substrate 1.

For example, the display region DR is a region for displaying information. The opening region OP is used for disposing a camera, an earpiece, and/or another structure. For example, an opening or a hole is provided in the opening region OP, and the camera, the earpiece, and/or another structure may be disposed in the opening or the hole in the opening region OP. The first peripheral region PR1 is equivalent to a region surrounding a periphery of the display region DR, and is used for disposing structures such as a wire located outside the display region DR. The second peripheral region PR2 is a region surrounding the opening region OP, and is used for disposing the second barrier structure 3 and the like. The first barrier structure 2 completely surrounds the display region DR to prevent an organic material from entering an edge region of the display panel when an organic structural layer (such as an organic light-emitting layer) of the display region DR of the display panel is formed. The second barrier structure 3 is also a closed structure, and completely surrounds the opening region OP, so as to prevent an organic material from entering the opening region OP when an organic structural layer (such as an organic light-emitting layer) of the display region DR of the display panel is formed, thereby protecting a structure in the opening region OP.

The first portion 41 of the crack detection line 4 surrounds the opening region OP. The first portion 41 is not closed, with a small gap between both ends of the first portion 41. Both ends of the second portion 42 of the crack detection line 4 are connected to both ends of the first portion 41, respectively, and the second portion 42 of the crack detection line 4 extends into the display region DR and the first peripheral region PR1. Thus, the first portion 41 and the second portion 42 of the crack detection line 4 form a closed wire.

Figure 2:
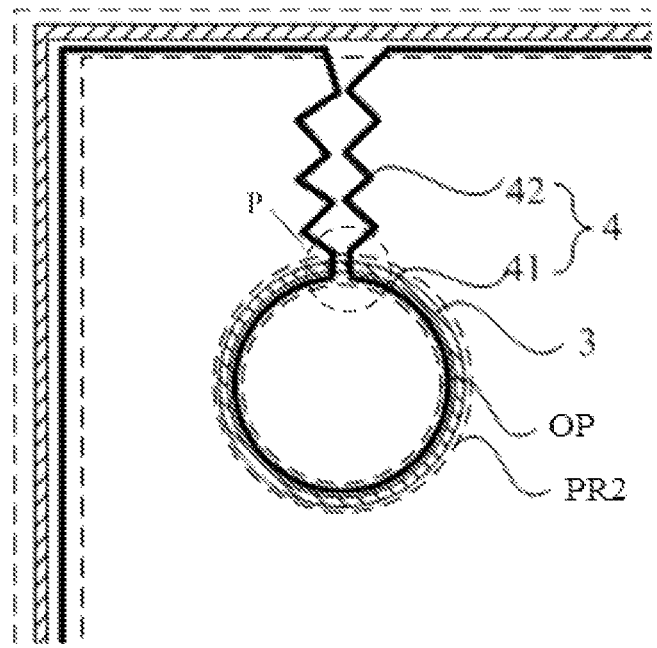
FIG. 2 is a schematic diagram showing a structure of a portion of a display panel according to an embodiment of the present disclosure.

Since the first portion 41 is located on the side of the second barrier structure 3 distal to the display region DR, and the second barrier structure 3 is a closed structure, the second portion 42 of the crack detection line 4, which extends to the display region DR, inevitably passes through the second barrier structure 3, as shown by the region P in FIG. 2.

It should be noted that, the first barrier structure 2 and the second barrier structure 3 of the display panel may be disposed in a same layer in an embodiment of the present disclosure. In a case where a slope of a sidewall of the first barrier structure 2 and a slope of a sidewall of the second barrier structure 3 are too steep or the barrier structures 2 and 3 are high, the sidewalls of the first barrier structure 2 and the second barrier structure 3 may form dead angles for processing such as etching, so that residual metal is easily formed near the first barrier structure 2 and the second barrier structure 3, which may cause short circuit of the crack detection line 4.

In the display panel according to the present embodiment, the height of the portion, which overlaps the second portion 42, of the second barrier structure 3 is less than the height of the first barrier structure 2, i.e., the height of the portion of the second barrier structure 3 overlapping the second portion 42 is reduced. After the height of the second barrier structure 3 is reduced, the residual metal on both sides of the second barrier structure 3 can be more easily and completely removed in the process of removing the residual metal, so that the crack detection line 4 above and near the second barrier structure 3 with a smaller height will not undergo short circuit. Therefore, compared with a display panel in the related art, the crack detection line 4 of the display panel according to the present embodiment is less likely to cause short circuit near the second barrier structure 3, so that the detection performance of the crack detection line 4 can be ensured, thereby ensuring a performance of the display panel.

In an embodiment, a height of the remaining portion of the second barrier structure 3 (e.g., a portion of the second barrier structure 3 located outside the region P, as shown in FIG. 2) other than the portion of the second barrier structure 3 overlapping the second portion 42 (e.g., the portion of the second barrier structure 3 located in the region P, as shown in FIG. 2) is greater than the height of the portion of the second barrier structure 3 overlapping the second portion 42.

That is, the height of the remaining portion of the second barrier structure 3 except the portion of the second barrier structure 3 overlapping the second portion 42 is still higher (i.e. the height of the portion of the second barrier structure 3 not overlapping the second portion 42 may be greater than the height of the portion of the second barrier structure 3 overlapping the second portion 42), so as to ensure the blocking performance of the second barrier structure 3 while ensuring that the crack detection line 4 is not subjected to short circuit, thereby improving the performance of the display panel.

Further, the remaining portion of the second barrier structure 3 (i.e., the portion of the second barrier structure 3 not overlapping the second portion 42) except the portion of the second barrier structure 3 overlapping the second portion 42 may have the same height as the height of the first barrier structure 2.

In an embodiment, a height of any portion of the second barrier structure 3 is less than the height of the first barrier structure 2.

That is, various portions of the second barrier structure 3 may have a constant height that is less than the height of the first barrier structure 2, which can simplify a manufacturing process of the second barrier structure 3.

For example, for the above-described structure of the second barrier structure 3, the second barrier structure 3 and any one of a spacer, a pixel defining layer, or a planarization layer of the display panel may be provided in a same layer and include a same material. It should be noted that, the second barrier structure 3 may alternatively have another suitable structure or include another suitable material, and is not limited to the above list.

Alternatively, the second barrier structure 3 of the display panel according to the present embodiment is formed by the spacer, the pixel defining layer, and the planarization layer. Further, a height of any portion of the so formed second barrier structure 3 is less than or equal to the height of the first barrier structure 2, so that residual metal is not easily formed, and the detection performance of the crack detection line 4 can be ensured.

Specifically, the height (e.g., the dimension relative to the upper surface of the substrate 1 in the direction perpendicular to the substrate 1) of the portion of the second barrier structure 3 overlapping the second portion 42 is 1 µm to 2 µm.

In an embodiment, an angle between a sidewall of the portion of the second barrier structure 3 overlapping the second portion 42 and the substrate 1 is an acute angle (as shown by an angle Q in FIG. 4), so that residual metal is not easily formed, and the detection performance of the crack detection line 4 can be ensured.

That is, the closer a sidewall of the portion of the second barrier structure 3 overlapping the second portion 42 to the substrate 1 is, the farther a distance from a centerline of the second barrier structure 3 is, so that the sidewall of the portion of the second barrier structure 3 overlapping the second portion 42 forms a slope.

Therefore, an etching dead angle will not easily exist on the sidewall of the portion of the second barrier structure 3 overlapping the second portion 42, and the residual metal on both sides of the second barrier structure 3 can be removed more easily and completely in a process of removing the residual metals, so that the crack detection line 4 above and near the second barrier structure 3 with a small height will not be subjected to short circuit.

In an embodiment, an angle between a sidewall of any portion of the second barrier structure 3 and the substrate 1 is an acute angle.

That is, sidewalls of the entire second barrier structure 3 may have a same structure, which can simplify the manufacturing process of the second barrier structure 3.

Figure 4:
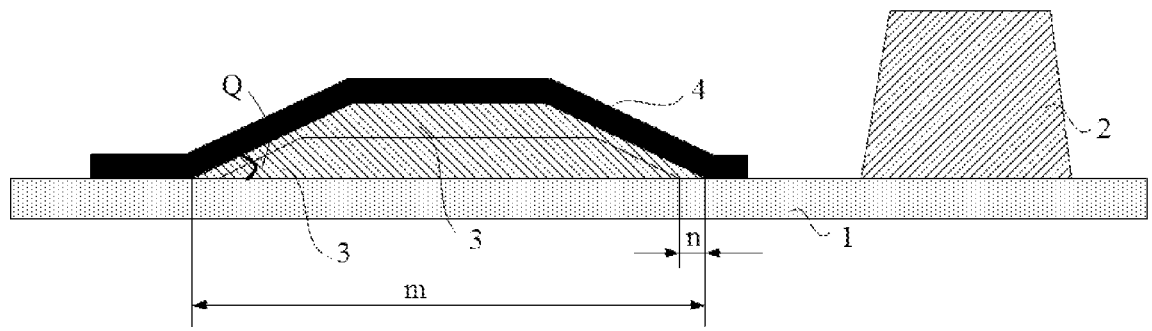
FIG. 4 is a schematic cross-sectional view of a portion of a second barrier structure of a display panel according to an embodiment of the present disclosure, and for example.

For example, the acute angle ranges from 20° to 45°, i.e., a supplementary angle of the angle Q shown in FIG. 4 is an obtuse angle, and the obtuse angle ranges from 135° to 160°.

In an embodiment, the second barrier structure 3 includes at least two layer structures stacked together, and a layer structure of the at least two layer structures farther away from the substrate 1 covers a layer structure of the at least two layer structures closer to the substrate 1, as shown in FIG. 4.

For example, a sidewall of each of the at least two layer structures of the second barrier structure 3 and the substrate 1 form an acute angle therebetween. A width of the layer structure of the at least two layer structures farther away from the substrate 1 is greater than a width of the layer structure of the at least two layer structures closer to the substrate 1, so that the layer structure of the at least two layer structures farther away from the substrate 1 completely covers the layer structure of the at least two layer structures closer to the substrate 1, which can further ensures that the sidewall of the second barrier structure 3 has a relatively gentle slope and thus is unlikely to have residual metal formed thereon. For example, as shown in FIG. 4, the width (i.e. the maximum distance between the two sidewalls) of the layer structure of the at least two layer structures farther away from the substrate 1 $m$ is greater than 20 µm, and the minimum distance n between a lower end of the sidewall of the layer structure of the at least two layer structures farther away from the substrate 1 and a lower end of the sidewall of the layer structure of the at least two layer structures closer to the substrate 1 is greater than 5 µm. In this way, it can ensure that the angle Q is small, so that it is unlikely that residual metal will be formed on the sidewall of the second barrier structure 3. For example, the at least two layer structures of the second barrier structure 3 may be two layer structures.

Alternatively, as for the case of the second barrier structure 3 including two layer structures as described above, the two layer structures of the second barrier structure 3 may be provided in the same layers as two of the spacer, the pixel defining layer, and the planarization layer of the display panel.

In an embodiment, the display panel further includes a display layer, an encapsulation layer, and a touch structure 5 (as shown in FIG. 6). For example, the display layer includes an array of Organic Light-emitting Diodes (OLEDs), located on the substrate 1 and in the display region DR. The encapsulation layer covers (e.g., completely covers) the display layer. The touch structure 5 (e.g., a touch panel) is located on the encapsulation layer, and includes at least one electrode layer. The crack detection line 4 and the at least one electrode layer are disposed in a same layer.

Further, the touch structure includes touch electrodes and touch wires. The at least one electrode layer includes a first electrode layer and a second electrode layer, and the crack detection line 4 and either or both of the first and the second electrode layers are arranged in a same layer. At least part of the second portion 42 is located on a side of the touch wires distal to the display region.

For example, the second barrier structure 3 may be formed firstly, and then the touch electrodes and the crack detection line 4 are formed so that the touch electrodes include the first electrode layer and the second electrode layer. Specifically, as shown in FIG. 6, the step of forming the touch structure 5 may include the following steps S1 to S5.

Step S1 may include forming the first insulating layer 52 on the encapsulation layer 51, which encapsulates display units, of the display panel (e.g., by chemical vapor deposition (CVD)), and a material of the first insulating layer 52 is typically silicon nitride (SiNx).

Step S2 may include forming the first electrode layer 53 on the first insulating layer 52 by using a patterning process, where the first electrode layer 53 may serve as a bridging film layer of the touch structure 5, and a material of the first electrode layer 53 is generally a three-layer metal of Ti/Al/Ti or a lamination of three layers of materials of ITO/Ag/ITO.

Step S3 may include forming the second insulating layer 54 on the first electrode layer 53, where the second insulating layer 54 may serve as an insulating layer between the first electrode layer 53 and a subsequently formed second electrode layer 55, so as to electrically isolate the first electrode layer 53 and the second electrode layer 55 from each other, and a material of the second insulating layer 54 is typically silicon nitride (SiNx).

Step S4 may include forming the second electrode layer 55 on the second insulating layer 54 by using a patterning process, where the second electrode layer 55 mainly serve as a wiring layer of the touch structure 5, and a material of the second electrode layer 55 is generally a three-layer metal of Ti/Al/Ti or a lamination of three layers of materials of ITO/Ag/ITO.

Step S5 may include forming the organic encapsulation layer 56 on the second electrode layer 55, and a material of each of the organic encapsulation layer 56 and the encapsulation layer 51 may be Polyimide (PI).

In this way, the touch structure 5 may be obtained, and the touch structure 5 may be a Flexible Multiple Layers On Cell (FMLOC).

Figure 3:
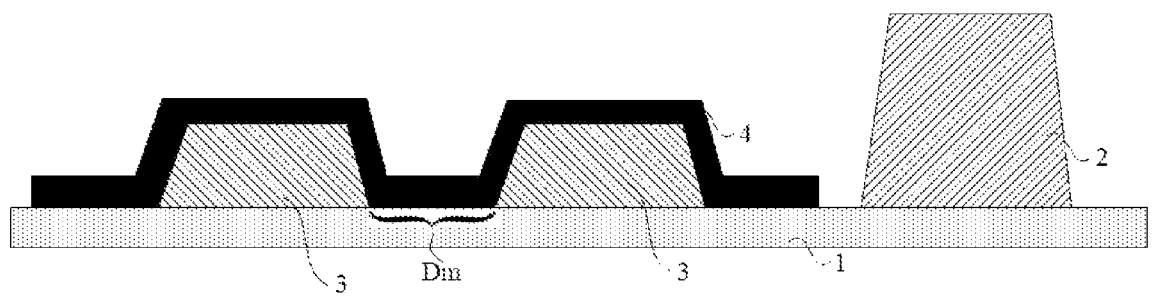
FIG. 3 is a schematic cross-sectional view of a portion of a second barrier structure of a display panel according to an embodiment of the present disclosure, and for example.

Further, as shown in FIG. 3, the second barrier structure 3 may include two sub-dams spaced apart from each other, and a minimum distance Dm between the two sub-dams of the second barrier structure 3 is greater than 20 μm. The second barrier structure 3 formed by the two sub-dams can more effectively prevent an organic material from entering the opening region OP when an organic structural layer (such as an organic light-emitting layer) of the display region of the display panel, which can protect a structure in the opening region OP. In addition, the minimum distance Dm between the two sub-dams being greater than 20 μm can more effectively avoid metal residue, thereby avoiding the problem of short circuit of the crack detection line 4 due to the residual metal. Further, each of the two sub-dams may have a shape of a trapezoid, and an angle between the sidewall of any portion of each of the two sub-dams and the substrate 1 is an acute angle ranging from 20° to 45°.

Specifically, the display panel may be any product or component having a display function, such as a liquid crystal display panel, an Organic Light-emitting Diode (OLED) display panel, electronic paper, a mobile phone, a tablet computer, a television, a display, a notebook computer, a digital photo frame, a navigator, or the like.

Figure 5:
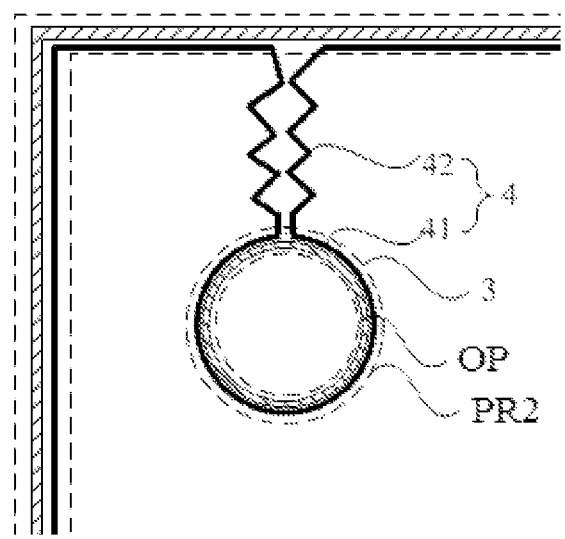
FIG. 5 is a schematic diagram showing a structure of a portion of a display panel according to an embodiment of the present disclosure.

In a second aspect, as shown in FIG. 5, the present embodiment provides another display panel having an opening region OP, a display region DR, a first peripheral region PR1, and a second peripheral region PR2. The opening region OP is located in the display region DR. The first peripheral region PR1 is located on a side of the display region DR distal to the opening region OP, and the second peripheral region PR2 is located between the opening region OP and the display region DR. The display panel includes a substrate 1, a first barrier structure 2, a second barrier structure 3, and a crack detection line 4. The first barrier structure 2 is disposed on the substrate 1, surrounds the display region DR, and is disposed in the first peripheral region PR1. The second barrier structure 3 is disposed on the substrate 1, surrounds the opening region OP, and is disposed in the second peripheral region PR2. The crack detection line 4 is on the substrate 1, and includes a first portion 41 and a second portion 42. The first portion 41 surrounds the opening region OP, and is located in the second peripheral region PR2, with a gap between two ends of the first portion 41. The first portion 41 is located on a side of the second barrier structure 3 proximal to the display region DR. Both ends of the second portion 42 are connected to both ends of the first portion 41, respectively, and the second portion 42 extends into the first peripheral region PR1 through the display region DR.

For example, the display region DR is a region for displaying information. The opening region OP is for arranging structures such as a camera, an earpiece and/or the like. The first peripheral region PR1 may be a region around the periphery of the display region DR, for disposing a wire and the like outside the display region DR. The second peripheral region PR2 may be a region surrounding the opening region OP, for disposing the second barrier structure 3 and the like. The first barrier structure 2 completely surrounds the display region DR to prevent an organic material from entering an edge region of the display panel when an organic structural layer (such as an organic light-emitting layer) of the display region DR of the display panel is formed. The second barrier structure 3 is also a closed structure, and completely surrounds the opening region OP, so as to prevent an organic material from entering the opening region OP when an organic structural layer (such as an organic light-emitting layer) of the display region DR of the display panel is formed, thereby protecting the structure of the opening region OP.

The first portion 41 of the crack detection line 4 surrounds the opening region OP. The first portion 41 is not closed, and there is a small gap between both ends of the first portion 41. Both ends of the second portion 42 of the crack detection line 4 are connected to both ends of the first portion 41, respectively, and the second portion 42 of the crack detection line 4 extends into the display region DR and the first peripheral region PR1. Thus, the first portion 41 and the second portion 42 of the crack detection line 4 form a closed wire.

Since the first portion 41 is located on the side of the second barrier structure 3 proximal to the display region DR, the second portion 42, which extends into the display region DR, of the crack detection line 4 does not pass through (or cross) the second barrier structure 3.

It should be noted that, in a display panel in the related art, since the first portion 41 is located on the side of the second barrier structure 3 distal to the display region DR, and the second barrier structure 3 is a closed structure, the second portion 42, which extends into the display region DR, of the crack detection line 4 inevitably passes through the second barrier structure 3. In addition, in a case where a slope of a sidewall of the first barrier structure 2 and a slope of a sidewall of the second barrier structure 3 are too steep (e.g., the sidewalls are perpendicular or approximately perpendicular to the substrate 1) or the barrier structures are relatively high, the sidewalls of the first barrier structure 2 and the second barrier structure 3 may form a dead angle for etching or the like, which will easily result in residual metal near the first barrier structure 2 and the second barrier structure 3, thereby causing short circuit of the crack detection line 4.

In the display panel according to the present embodiment, since the first portion 41 is located on the side of the second barrier structure 3 proximal to the display region DR, the second portion 42, which extends to the display region DR, of the crack detection line 4 does not pass through the second barrier structure 3. As such, compared with the display panel in the related art, the crack detection line 4 in the display panel according to the present embodiment does not undergo short circuit due to the residual metal at the second barrier structure 3, so that the detection performance of the crack detection line 4 can be ensured, and the performance of the display panel can be ensured.

In addition, in the display panel according to the present embodiment, the phenomenon of short circuit of the crack detection line 4 due to the residual metal at the second barrier structure 3 can be avoided by only slightly changing the positions where the first portion 41 of the crack detection line 4 and the second barrier structure 3 are formed, thereby simplifying the manufacturing method of the display panel, and ensuring that the manufacturing cost thereof is low.

For example, the crack detection line 4 may be provided in the same layer as the first electrode layer 53 or the second electrode layer 55, and the crack detection line 4 and the first or second electrode layer 53 or 55 may include a same material.

The display panel according to any one of the above-described embodiments of the present disclosure can at least avoid the problem that the crack detection line is short-circuited due to the residual metal.

It should be noted that, the foregoing embodiments of the present disclosure may be combined with each other in a case of no explicit conflict.

It should be noted that, in the present disclosure, relational terms such as first, second, and the like are used solely for distinguishing one entity or action from another entity or action without necessarily requiring or implying any actual such relationship or order between such entities or actions.

Further, the term of "including", "comprising", or any other variation thereof, are intended to cover a non-exclusive inclusion, such that a process, method, article, or apparatus having a list of elements has not only those elements but also may have other elements not expressly listed or inherent to such process, method, article, or apparatus. Without further limitation, an element defined by the phrase "comprising (or including) a . . . " does not exclude the presence of other identical elements in the process, method, article, or apparatus having the element.

In accordance with the foregoing description of the disclosed embodiments, these embodiments are not intended to be exhaustive or to limit a claimed invention to the precise embodiments disclosed herein. Obviously, many modifications and variations are possible in light of the foregoing description. The embodiments are chosen and described in detail in order to best explain the principles of the present disclosure and a practical application, to thereby enable one of ordinary skill in the art to best utilize the present disclosure and various embodiments with various modifications as are suited to the particular use contemplated. The present disclosure is to be limited only by the appended claims, their full scope and equivalents.

What is claimed is:

1. A display panel, having an opening region, a display region, a first peripheral region, and a second peripheral region, the opening region being in the display region, the first peripheral region being on a side of the display region distal to the opening region, the second peripheral region being between the opening region and the display region, the display panel comprising:
    a substrate;
    a first barrier structure on the substrate, surrounding the display region, and in the first peripheral region;
    a second barrier structure on the substrate, surrounding the opening region, and in the second peripheral region; and
    a crack detection line on the substrate, wherein the crack detection line comprises a first portion and a second portion, the first portion surrounds the opening region and is in the second peripheral region, both ends of the first portion have a gap therebetween, the first portion of the crack detection line is on a side of the second barrier structure distal to the display region, both ends of the second portion are connected to both ends of the first portion, respectively, an orthogonal projection of the second portion on the substrate overlaps an orthogonal projection of the second barrier structure on the substrate, the second portion extends into the first peripheral region through the display region, and a height of a portion, which overlaps the second portion, of the second barrier structure is less than a height of the first barrier structure, and each height is a dimension in a direction perpendicular to the substrate;
    wherein an angle between a sidewall of the portion of the second barrier structure overlapping the second portion and the substrate is an acute angle;
    wherein the second barrier structure comprises at least two layer structures stacked together, and a layer structure of the at least two layer structures farther away from the substrate covers a layer structure of the at least two layer structures closer to the substrate; and
    wherein a minimum distance, between a lower end of a sidewall of the layer structure of the at least two layer structures farther away from the substrate and a lower end of a sidewall of the layer structure of the at least two layer structures closer to the substrate, is greater than 5 μm.

2. The display panel according to claim 1, wherein a height of a remaining portion of the second barrier structure except the portion of the second barrier structure overlapping the second portion is greater than the height of the portion of the second barrier structure overlapping the second portion.

3. The display panel according to claim 1, wherein a height of any portion of the second barrier structure is less than the height of the first barrier structure.

4. The display panel according to claim 1, wherein the height of the portion of the second barrier structure overlapping the second portion ranges from 1 μm to 2 μm.

5. The display panel according to claim 1, wherein an angle between a sidewall of any portion of the second barrier structure and the substrate is an acute angle.

6. The display panel according to claim 1, wherein the acute angle ranges from 20° to 45°.

7. The display panel according to claim 1, wherein a maximum distance between two sidewalls of the layer structure of the at least two layer structures farther away from the substrate is greater than 20 μm.

8. The display panel according to claim 1, wherein the second barrier structure comprises two sub-dams spaced apart from each other.

9. The display panel according to claim 8, wherein a minimum distance between the two sub-dams of the second barrier structure is greater than 20 μm.

10. A display panel, having an opening region, a display region, a first peripheral region, and a second peripheral region, the opening region being in the display region, the first peripheral region being on a side of the display region distal to the opening region, the second peripheral region being between the opening region and the display region, the display panel comprising:
a substrate;
a first barrier structure on the substrate, surrounding the display region, and in the first peripheral region;
a second barrier structure on the substrate, surrounding the opening region, and in the second peripheral region; and
a crack detection line on the substrate, wherein the crack detection line comprises a first portion and a second portion, the first portion surrounds the opening region and is in the second peripheral region, both ends of the first portion have a gap therebetween, the first portion is on a side of the second barrier structure proximal to the display region, both ends of the second portion are connected to both ends of the first portion, respectively, and the second portion extends into the first peripheral region through the display region;
wherein the second barrier structure comprises at least two layer structures stacked together, and a layer structure of the at least two layer structures farther away from the substrate covers a layer structure of the at least two layer structures closer to the substrate; and
wherein a minimum distance, between a lower end of a sidewall of the layer structure of the at least two layer structures farther away from the substrate and a lower end of a sidewall of the layer structure of the at least two layer structures closer to the substrate, is greater than 5 μm.

11. The display panel according to claim 10, wherein a height of any portion of the second barrier structure is less than or equal to a height of the first barrier structure.

12. The display panel according to claim 10, wherein an angle between a sidewall of any portion of the second barrier structure and the substrate is an acute angle.

13. The display panel according to claim 12, wherein the acute angle ranges from 20° to 45°.

14. The display panel according to claim 10, wherein a maximum distance between two sidewalls of the layer structure of the at least two layer structures farther away from the substrate is greater than 20 μm.

15. The display panel according to claim 10, wherein the second barrier structure comprises two sub-dams spaced apart from each other, and a minimum distance between the two sub-dams of the second barrier structure is greater than 20 μm.

* * * * *